United States Patent
Demin

(10) Patent No.: US 10,288,469 B2
(45) Date of Patent: May 14, 2019

(54) MAGNETOSTRICTIVE TRANSDUCER

(71) Applicant: Franklin Fueling Systems, Inc., Madison, WI (US)

(72) Inventor: Vitaliy Demin, Saco, ME (US)

(73) Assignee: Franklin Fueling Systems, LLC, Madison, WI (US)

( * ) Notice: Subject to any disclaimer, the term of this patent is extended or adjusted under 35 U.S.C. 154(b) by 0 days.

(21) Appl. No.: 14/186,235

(22) Filed: Feb. 21, 2014

(65) Prior Publication Data

US 2014/0260601 A1 Sep. 18, 2014

Related U.S. Application Data

(60) Provisional application No. 61/777,730, filed on Mar. 12, 2013.

(51) Int. Cl.
- *G01F 23/30* (2006.01)
- *G01F 23/72* (2006.01)
- *G01R 33/18* (2006.01)
- *H01P 3/10* (2006.01)
- *H01P 3/06* (2006.01)

(52) U.S. Cl.
CPC .............. *G01F 23/72* (2013.01); *G01R 33/18* (2013.01); *H01P 3/10* (2013.01); *H01P 3/06* (2013.01)

(58) Field of Classification Search
USPC ........................................................ 73/305
See application file for complete search history.

(56) References Cited

U.S. PATENT DOCUMENTS

| | | |
|---|---|---|
| 3,517,343 A | 6/1970 | Crim |
| 3,898,555 A | 8/1975 | Tellerman |
| 4,819,858 A | 4/1989 | Malone et al. |
| 4,839,590 A | 6/1989 | Koski |
| 5,070,485 A | 12/1991 | Nyce |
| 5,076,100 A | 12/1991 | Hunter et al. |
| 5,160,379 A | 11/1992 | Yoshizawa et al. |
| 5,196,791 A | 3/1993 | Dumais |
| 5,223,349 A | 6/1993 | Kudo et al. |
| 5,476,209 A | 12/1995 | Kojima et al. |
| 5,627,380 A | 5/1997 | Crowne |
| 5,640,880 A | 6/1997 | Mulrooney |
| 5,848,549 A * | 12/1998 | Nyce .................. G01F 23/72 324/207.13 |
| 5,886,518 A | 3/1999 | Kuroda et al. |
| 5,929,763 A | 7/1999 | Koski |
| 6,058,775 A | 5/2000 | Levy |
| 6,271,660 B1 * | 8/2001 | Sprecher, Jr. ........ G01D 5/485 324/207.13 |
| 6,356,071 B1 | 3/2002 | Koski |

(Continued)

FOREIGN PATENT DOCUMENTS

JP 2003042860 2/2003

OTHER PUBLICATIONS

International Search Report in corresponding international application No. PCT/US2014/017612, dated Jul. 16, 2014, 2 pages.

(Continued)

*Primary Examiner* — Eric S. McCall

(74) *Attorney, Agent, or Firm* — Faegre Baker Daniels LLP

(57) ABSTRACT

A transducer includes a composite waveguide including a composite wire having an internal core of low electrical resistance material and an outer layer of magnetostrictive material.

25 Claims, 3 Drawing Sheets

(56) References Cited

U.S. PATENT DOCUMENTS

| | | |
|---|---|---|
| 6,903,544 B2 | 6/2005 | Kurz |
| 6,919,779 B2 | 7/2005 | Raphalovitz et al. |
| 7,278,311 B1 | 10/2007 | Demin |
| 7,621,368 B2 | 11/2009 | Shimizu et al. |
| 8,878,682 B2 | 11/2014 | Kenney et al. |
| 2010/0008524 A1 | 1/2010 | Burleigh et al. |
| 2011/0090088 A1* | 4/2011 | Kenney .................. G01F 23/68 |
| | | 340/623 |

OTHER PUBLICATIONS

International Preliminary Report on Patentability in corresponding International Application No. PCT/US2014/017612, dated Sep. 15, 2015, 5 pages.

International Preliminary Report on Patentability for corresponding application PCT/US2014/017612; dated Sep. 15, 2015; 5 pages.

* cited by examiner

MAGNETOSTRICTIVE TRANSDUCER

RELATED APPLICATIONS

This application claims the benefit of U.S. Provisional Application Ser. No. 61/777,730, filed Mar. 12, 2013, titled MAGNETOSTRICTIVE TRANSDUCER, the entire disclosure of which is expressly incorporated by reference herein.

TECHNICAL FIELD

The disclosure relates generally to transducers with magnetostrictive waveguides.

BACKGROUND OF THE DISCLOSURE

Magnetostrictive transducers are widely used for distance and liquid level measurements. Magnetostriction is a property of ferromagnetic materials such as iron, nickel, and cobalt. When placed in a magnetic field, these materials change size and/or shape. Distance and liquid level transducers exploit these properties.

Generally, an elongate magnetostrictive waveguide stretched along the length of a transducer's measurement range interacts with the magnetic field of a permanent magnet located at a position to be detected The interaction of a magnetic field from a permanent magnet located at the position to be detected and a magnetic field from short interrogation current pulses passed through the wave guide generate torsional strain waves that propagate from a position to be detected to the pick-up located at one end of the wave guide. The time between an interrogation pulse and arrival of the torsional strain to the pick-up represent a distance. An electronic circuit transmits the interrogation signal through the transducer and senses the torsional strain wave caused by the interaction of the interrogation signal and the magnets. To determine the volume of product in a storage tank, the distance between the horizontal surfaces of the product are determined and the volume is calculated based on the shape of the storage tank and the distances. More than one float can support respective magnets. If the product is less dense than water, water may be found below the product. As the volume of product and the water increase or decrease, the floats move up or down along the magnetostrictive waveguide.

Magnetostrictive materials are effective at generating and transmitting torsional strain waves but exhibit relatively high electrical resistance. A low resistance wire may be used to transmit the interrogation signal. The wire may be inserted in a tubular magnetostrictive wave guide. The length of the transducer and the waveguide is constrained by the internal diameter of the tubular waveguide and the diameter and malleability of the wire. As the diameters decrease, it becomes increasingly more difficult to insert the wire in the tubular waveguide, which limits the practical length of the transducer. On the other hand, if a solid wire wave guide is used to transmit the interrogation signal, additional power is required to overcome the high electrical resistance of the magnetostrictive material. The solid wire approach is less suitable in battery powered systems especially for long transducers.

A need exists for a magnetostrictive transducer that is economical to manufacture and use.

BRIEF DESCRIPTION OF THE DRAWINGS

The above-mentioned and other disclosed features, and the manner of attaining them, will become more apparent and will be better understood by reference to the following description of disclosed embodiments taken in conjunction with the accompanying drawings, wherein.

Figure 1:
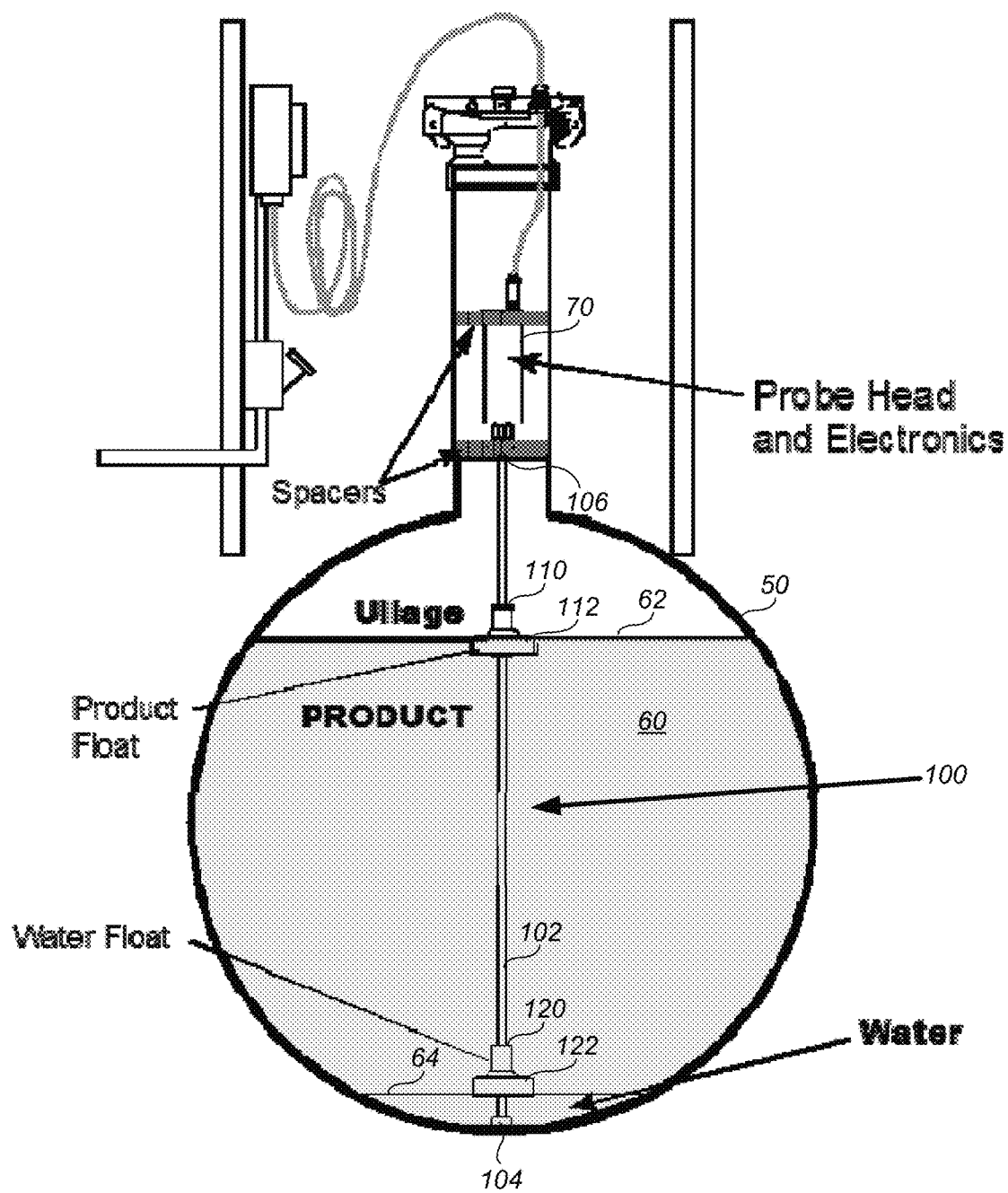
FIG. 1 is a schematic diagram of a liquid level transducer.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present invention. The exemplification set out herein illustrates embodiments of the disclosure, and such exemplifications are not to be construed as limiting the scope of the invention in any manner.

DETAILED DESCRIPTION

Briefly, a magnetostrictive transducer includes a composite waveguide having an internal core of low electrical resistance material and an outer layer, or sheath, of magnetostrictive material. The internal core may comprise copper. The outer layer envelops the internal core such that the outer diameter of the core equals the internal diameter of the sheath. In one embodiment, the composite waveguide is produced by inserting a conductive rod into a magnetostrictive tube. The tube and the rod are drawn, or stretched, to form the composite wire which can be used as a waveguide. In one example, the magnetostrictive sheath comprises an alloy including nickel, iron and chromium. In a variation thereof, the alloy further includes titanium. In one example, the alloy includes less than 5% by weight of titanium. In a variation thereof, the alloy further includes aluminum. An exemplary magnetostrictive material is a NI-SPAN-C™ alloy manufactured by Alloy Wire International Ltd., a United Kingdom limited liability company.

In one embodiment, a liquid storage system is provided. The liquid storage system can store one or more liquids. The one or more liquids have different densities. A magnetostrictive transducer includes a composite waveguide having an internal core of low electrical resistance material and an outer layer of magnetostrictive material. One or more height detectors, each height detector including a float and a magnet, are configured to float at heights determined by the different densities of the one or more liquids. A control apparatus is operable to transmit an interrogation signal through the internal core and to sense one or more waves corresponding to the heights at which the one or more height detectors float.

In another embodiment, a method of detecting liquid levels in a liquid storage system is provided. The method comprises providing a storage tank that contains one or more liquids having different densities, providing a magnetostrictive transducer including a composite waveguide having an internal core of low electrical resistance material and an outer layer of magnetostrictive material, and providing one or more height detectors, each height detector including a float and a magnet, configured to float at heights determined by the different densities of the one or more liquids. The method further comprises transmitting an interrogation signal through the internal core of a composite waveguide, sensing one or more waves on the composite waveguide corresponding to the heights at which the height detectors float, and calculating the heights based on the sensed one or more waves.

A composite waveguide can be produced by drawing, or stretching, the tube and the rod. The composite waveguide may be made as long as necessary. Longer waveguides may be made by increasing the initial diameters of the tube and the rod and increasing the final stretch ratio, which is the ratio of the final length to the initial length of the tube and the rod.

FIG. 1 is a schematic diagram of a liquid level transducer 100 comprising a composite waveguide 102 extending from one end 104 to an opposite end 106. Waveguide 102 is inside a storage tank 50 containing a liquid product 60 suspended on water. The volume of product 60 is defined in part by the distance between a water level 64 and a product level 62. A first float 112 and a second float 122 support, respectively, a magnet 110 and a magnet 120. A float and a magnet may be referred to as a height or level detector. The densities of first float 112 and second float 122 are configured to cause first float 112 and second float 122 to float, respectively, on liquid product 60 and the water. As the volume of product 60 and the water increase or decrease, floats 112 and 122 move up or down along composite waveguide 102. Liquid level transducer 100 is configured to determine the heights at which the height detectors float, which correspond to water level 64 and product level 62. The volume of liquid product 60 is determined from said heights. Liquid level transducer 100 may include additional height detectors. The height detectors may be calibrated to be buoyant at particular densities to detect the heights of the surfaces of multiple liquids and/or density differentials of one or more liquid products. A method and apparatus for detection of phase separation in storage tanks is disclosed in commonly owned U.S. patent application Ser. No. 12/580,493, filed Oct. 16, 2009, the entire disclosure of which is incorporated herein by reference.

An electronic module 70 transmits an interrogation signal down composite waveguide 102 and senses a torsional strain wave caused by twisting of composite waveguide 102 in response to the interaction of the interrogation signal and magnets 110 and 120. Electronic module 70 may output signals corresponding to the interrogation signal and the strain wave signal to a computing device configured to determine the sensed levels. Electronic module 70 may include the computing device and may output the level values. The computing device and electronic module 70 may be referred to as a control apparatus.

The interrogation signals may be very short. In one example, the interrogation signal duration is a few microseconds, e.g. between 1 and 5 microseconds. An interrogation current pulses through composite waveguide 102 and generates a circumferential magnetic field. When the magnetic fields of the magnets interact with the circumferential magnetic field, the portion of composite waveguide 102 located on one side of the magnet rotates in one direction and the portion of composite waveguide 102 located on another side of the magnet rotates in the opposite direction, creating a torsional strain at a point between the two portions. When the interrogation current pulses end, the torsional strain relaxes creating a torsional strain wave which runs in both directions along composite waveguide 102. One wave runs directly to electronic module 70 where a sensor generates an electric wave signal and the other is reflected at the opposite end of composite waveguide 102 and dampened or ignored. The time between a wave signal generated by a reference magnet and a wave signal generated by a product magnet represents a distance between the magnets which can be converted into a product level. The conversion is based on the sound wave propagation speed through composite waveguide 102, which is measured during a calibration process. Composite waveguide 102 may be enclosed in a stainless steel shaft to enable its use in corrosive environments, for example. The propagation speed and reflection of composite waveguide 102 are determined, at least in part, by its hardness.

The resolution of a magnetostrictive transducer may be 0.025 mm (0.001 inch) or better. The accuracy of the magnetostrictive transducer may be ±1.0 mm (0.040") or better. The level measurements may be temperature compensated, especially when the magnetostrictive transducer is used for leak detection. During leak detection, the temperature compensated volume of product in a tank is determined over time. Volume differences are indicative of leakage. The time between measurements is used to determine the leakage rate.

Once the level and temperature information is transmitted by electronics module 70, the control apparatus uses tank and transducer information to determine volumes and density, and to detect and measure leaks. Tank parameters include length, diameter, type, radius of domed ends (if applicable), and any other information suitable to compute product volume and density. Other parameters include the float type, product time, waveguide length and waveguide gradient. The waveguide gradient indicates how fast a torsional strain travels through the waveguide. The control apparatus takes the product and water float level information, accounts for the temperatures of the sensors, and uses the tank parameters determine liquid volumes including the product volume.

Figure 2:
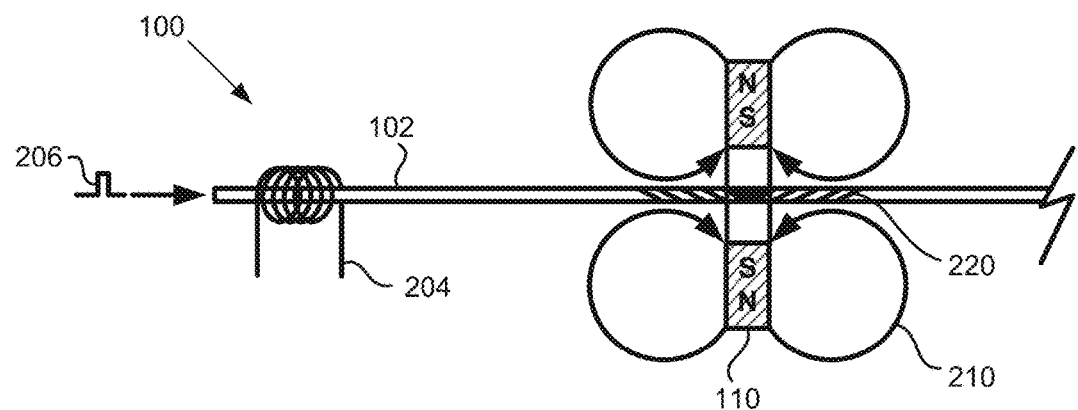
FIG. 2 is a schematic diagram illustrating the operation of the liquid level transducer of FIG. 1.

FIG. 2 is a schematic diagram of transducer 100 illustrating its operation. Magnet 110 is ring shaped and has a magnetic field 210. An interrogation pulse 206 is transmitted through waveguide 102 which causes waveguide 102 to twist at the point where interrogation pulse 206 crosses magnetic field 210, which generates a torsional strain wave 220 to travel through waveguide 102. A sensor, illustratively a coil 204, detects torsional strain wave 220 and generates an electrical pulse. The time between the introduction of interrogation pulse 206 and detection of the strain wave determines the distance from coil 204 to magnet 110.

Figure 3:
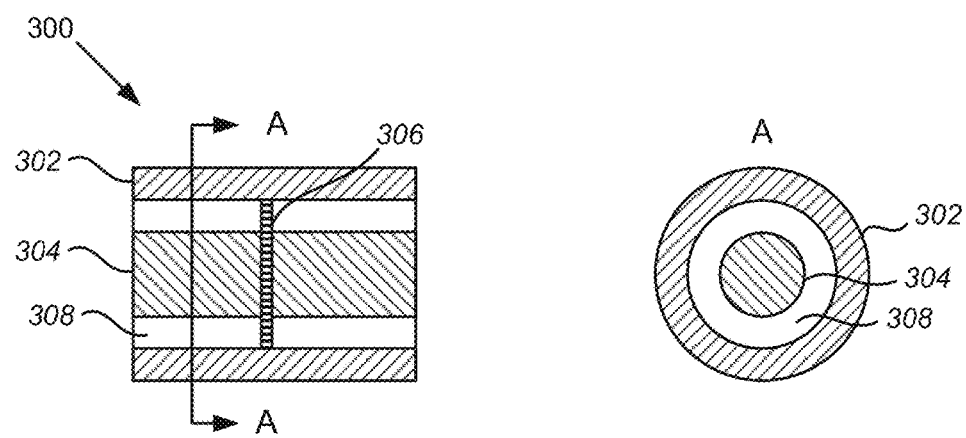
FIG. 3 is a cross-sectional view of a traditional waveguide.

Referring to FIG. 3, a traditional waveguide 300 comprises a small diameter magnetostrictive tube 302 and a wire conductor 304 positioned inside tube 302. The internal diameter of tube 302 is greater than the external diameter of wire conductor 304 to create a volume 308 which enables insertion of wire conductor 304 through magnetostrictive tube 302. A spacer 306 may be provided to facilitate insertion. Wire conductor 304 transmits the interrogation pulses and magnetostrictive tube 302 transmits the torsional strain wave. The maximum length of the traditional waveguide is limited by its method of manufacture.

Figure 4:
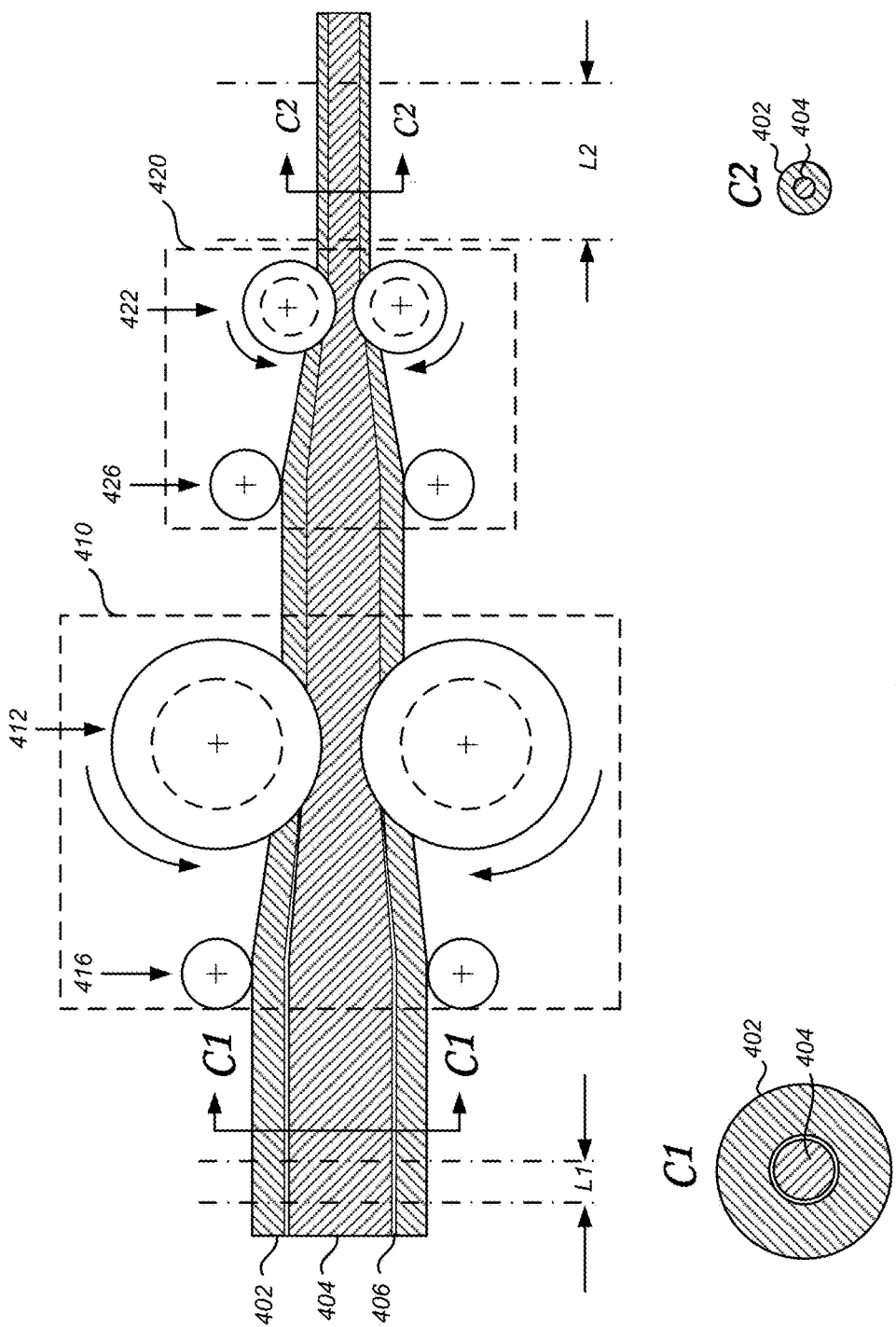
FIG. 4 is a schematic diagram of a method to make a composite waveguide in accordance with an embodiment set forth in the disclosure.

FIG. 4 is a schematic diagram of a method to make composite waveguide 102. Composite waveguide 102 comprises an electrical conductor 404 enveloped by magnetostrictive material. Initially, a rod of electric conductor 404, having an initial external diameter, is placed inside a magnetostrictive tube 402 having initial external and internal diameters defining an air gap 406 therebetween. The initial internal diameter of magnetostrictive tube 402 may be larger than the initial external diameter of conductor 404 to facilitate its placement. Magnetostrictive tube 402 and electric conductor 404 are drawn in two or more drawing stages. In one example, the drawing stages include conical dies. The diameters of magnetostrictive tube 402 and conductor 404 are simultaneously reduced as they are pulled through the conical dies. In another example, exemplified in FIG. 4, a pair of drawing stages 410 and 420 include pairs of drawing units 412 and 422, exemplified by opposing wheels. Drawing nips comprising rollers may be used instead of wheels. Isolation units may be added to control the draw ratio of each drawing station. A pair of isolation units 416 and 426, exemplified by nips having nip rollers, are shown. The draw ratio may be defined as the ratio of the length of an outgoing portion of magnetostrictive tube 402 to a corresponding incoming portion. The draw ratio of a drawing station may be defined as the ratio of the outgoing and incoming surface speeds of magnetostrictive tube 402. Additional drawing stages may be added. Temperature treatment units configured to define characteristics of magnetostrictive tube 402 and electric conductor 404 may be provided. Exemplary characteristics may include crystallinity, hardness and reflection efficiency. Reflection efficiency is determined, at least in part, by hardness. Any number of drawing stages may be used to achieve desired characteristics. The drawing stages may be configured to cold-draw or to hot draw by, for example, temperature controlling the drawing and isolation units. Heat treatment units may be added between drawing stages to control the crystallinity and/or hardness of the material entering the drawing stations.

The cross-sections C1 and C2 of two sections of magnetostrictive tube 402 and electric conductor 404 illustrate the diameters of magnetostrictive tube 402 and electric conductor 404 as they are reduced during a drawing process. Also shown are an initial length L1 of magnetostrictive tube 402 and a final corresponding length L2 representative of the amount of drawing. The lengths may be determined by the surface speeds of magnetostrictive tube 402 at the corresponding cross-sections. The ratio L1:L2 is the draw, or stretch, ratio of magnetostrictive tube 402. Conductor 404 may be proportionally drawn an equal or different amount depending on their initial diameters.

A traditional tube/space/wire waveguide has a length which is limited by the manufacturing process. In one embodiment, the composite wire has a length to diameter ratio Lc/Dc which is greater than the L/D ratio of the traditional tube/space/wire waveguide.

A traditional magnetostrictive wire has relatively greater electrical resistance than a composite wire of the same length. In low power applications, the length of the magnetostrictive wire is limited by the amount of power of the interrogation signal. If the power is increased above a certain level, the magnetostrictive transducer with a solid wire waveguide may no longer be suitable for hazardous environment applications, such as level sensing in fuel tanks, or may require an expensive explosion-proof enclosure. In one embodiment, a composite waveguide used in hazardous environments has a length which is greater than the maximum length of a solid magnetostrictive wire operable in the hazardous environment without an explosion-proof enclosure. In one example, the length of the composite waveguide is greater than about 15 feet. In another example, the length is greater than about 25 feet. In a further example, the length is greater than about 30 feet.

The above detailed description of the invention and the examples described therein have been presented only for the purposes of illustration and description. It is therefore contemplated that the present invention cover any and all modifications, variations or equivalents that fall within the spirit and scope of the basic underlying principles disclosed above and claimed herein.

What is claimed is:

1. A composite waveguide used in magnetostrictive transducers, the composite waveguide comprising:
   an internal core of low electrical resistance material and an outer layer of magnetostrictive material having an initial hardness,
   wherein the low electrical resistance material comprises an electrical conductor having an initial external diameter,
   wherein the outer layer comprises a tube of magnetostrictive material which in an initial state has an initial hardness and an initial internal diameter larger than the initial external diameter of the electrical conductor,
   wherein the composite waveguide is longitudinally stretched as a result of simultaneously drawing the electrical conductor and the tube of magnetostrictive material in two or more drawing stages to simultaneously reduce the initial internal diameter of the tube of magnetostrictive material and the initial external diameter of the electrical conductor to a final internal diameter of the tube of magnetostrictive material that is equal to a final external diameter of the electrical conductor and thereby the composite waveguide is devoid of a longitudinal air gap between the internal core and the outer layer,
   wherein said drawing changes the initial hardness to a desired, final hardness of the magnetostrictive material, and
   wherein the outer layer and the internal core are substantially coextensive.

2. A composite waveguide as in claim 1, wherein the internal core has an external surface and the outer layer has an internal surface, and substantially the entire internal surface of the outer layer contacts the external surface of the internal core.

3. A composite waveguide as in claim 1, wherein the diameter of the internal core equals the internal diameter of the outer layer.

4. A composite waveguide as in claim 1, wherein the composite waveguide has a length to diameter ratio, Lc/Dc, which is greater than a maximum length to diameter ratio of a waveguide consisting of an internal wire inside a magnetostrictive tube and a volume therebetween.

5. A composite waveguide as in claim 1, wherein the internal core comprises copper and the outer layer comprises a nickel-iron-chromium alloy.

6. A composite waveguide as in claim 5, wherein the nickel-iron-chromium alloy further includes titanium.

7. A magnetostrictive transducer comprising:
   a composite waveguide having an internal core of low electrical resistance material and an outer layer of magnetostrictive material having an initial hardness,
   wherein the low electrical resistance material comprises an electrical conductor having an initial external diameter,
   wherein the outer layer comprises a tube of magnetostrictive material which in an initial state has an initial hardness and an initial internal diameter larger than the initial external diameter of the electrical conductor,
   wherein the composite waveguide is longitudinally stretched as a result of simultaneously drawing the electrical conductor and the tube of magnetostrictive material in two or more drawing stages to simultaneously reduce the initial internal diameter of the tube of magnetostrictive material and the initial external diameter of the electrical conductor to a final internal diameter of the tube of magnetostrictive material that is equal to a final external diameter of the electrical conductor and thereby the composite waveguide is devoid of a longitudinal air gap between the internal core and the outer layer, wherein said drawing changes the initial hardness to a desired, final hardness of the magnetostrictive material, and wherein the outer layer and the internal core are substantially coextensive.

8. A magnetostrictive transducer as in claim 7, wherein the internal core has an external surface and the outer layer has an internal surface, and substantially the entire internal surface of the outer layer contacts the external surface of the internal core.

9. A magnetostrictive transducer as in claim 7, wherein the internal core comprises copper and the outer layer is a nickel-iron-chromium alloy.

10. A magnetostrictive transducer as in claim 9, wherein the nickel-iron-chromium alloy further includes titanium.

11. A magnetostrictive transducer as in claim 7, wherein the magnetostrictive transducer is operable in a hazardous environment without an explosion-proof enclosure and the composite waveguide has a length which is greater than about 15 feet.

12. A magnetostrictive transducer as in claim 11, wherein the composite waveguide has a length which is greater than about 25 feet.

13. A magnetostrictive transducer as in claim 11, wherein the composite waveguide has a length which is greater than about 30 feet.

14. A liquid storage system comprising:
a storage tank containing one or more liquids having different densities;
a magnetostrictive transducer including a longitudinally stretched composite waveguide having an internal core of low electrical resistance material and an outer layer of magnetostrictive material, wherein the low electrical resistance material comprises an electrical conductor having an initial external diameter, wherein the outer layer comprises a tube of magnetostrictive material which in an initial state has an initial hardness and an initial internal diameter larger than the initial external diameter of the electrical conductor,
wherein the composite waveguide is longitudinally stretched as a result of simultaneously drawing the electrical conductor and the tube of magnetostrictive material in two or more drawing stages to simultaneously reduce the initial internal diameter of the tube of magnetostrictive material and the initial external diameter of the electrical conductor to a final internal diameter of the tube of magnetostrictive material that is equal to a final external diameter of the electrical conductor and thereby the composite waveguide is devoid of a longitudinal air gap between the internal core and the outer layer, wherein said drawing changes the initial hardness to a desired, final hardness of the magnetostrictive material, and wherein the outer layer and the internal core are substantially coextensive;
one or more height detectors, each height detector including a float and a magnet, the one or more height detectors configured to float at heights determined by the different densities of the one or more liquids; and
a control apparatus operable to transmit an interrogation signal through the internal core and to sense one or more waves corresponding to the heights at which the one or more height detectors float.

15. A liquid storage system as in claim 14, wherein the internal core of the composite waveguide comprises copper and the outer layer is a nickel-iron-chromium alloy.

16. A liquid storage system as in claim 14, wherein the internal core has an external surface and the outer layer has an internal surface, and substantially the entire internal surface of the outer layer contacts the external surface of the internal core.

17. A liquid storage system as in claim 14, wherein the liquid storage system is configured to store a hazardous liquid and the composite waveguide has a length which is greater than about 15 feet and is operable in the liquid storage system without an explosion-proof enclosure.

18. A liquid storage system as in claim 17, wherein the length of the composite waveguide is greater than about 25 feet.

19. A liquid storage system as in claim 17, wherein the length of the composite waveguide is greater than about 30 feet.

20. A method of detecting liquid levels in a liquid storage system, the method comprising:
providing a storage tank that contains one or more liquids having different densities;
providing a magnetostrictive transducer including a longitudinally stretched composite waveguide having an internal core of low electrical resistance material and an outer layer of magnetostrictive material, wherein the low electrical resistance material comprises an electrical conductor having an initial external diameter, wherein the outer layer comprises a tube of magnetostrictive material which in an initial state has an initial hardness and an initial internal diameter larger than the initial external diameter of the electrical conductor, wherein the composite waveguide is longitudinally stretched as a result of simultaneously drawing the electrical conductor and the tube of magnetostrictive material in two or more drawing stages to simultaneously reduce the initial internal diameter of the tube of magnetostrictive material and the initial external diameter of the electrical conductor to a final internal diameter of the tube of magnetostrictive material that is equal to a final external diameter of the electrical conductor and thereby the composite waveguide is devoid of a longitudinal air gap between the internal core and the outer layer, wherein said drawing changes the initial hardness to a desired, final hardness of the magnetostrictive material, and wherein the outer layer and the internal core are substantially coextensive;
providing one or more height detectors, each height detector including a float and a magnet, the one or more height detectors configured to float at heights determined by the different densities of the one or more liquids;
transmitting an interrogation signal through the internal core of a composite waveguide;
sensing one or more waves on the composite waveguide corresponding to the heights at which the height detectors float; and
calculating the heights based on the sensed one or more waves.

21. A method as in claim 20, wherein the internal core of the composite waveguide comprises copper and the outer layer is a nickel-iron-chromium alloy.

22. A method as in claim 20, wherein the internal core has an external surface and the outer layer has an internal surface, and substantially the entire internal surface of the outer layer contacts the external surface of the internal core.

23. A method of making a composite waveguide, the method comprising:
inserting an electrical conductor having an initial external diameter into a tube of magnetostrictive material having an initial hardness and an initial internal diameter larger than the initial external diameter of the electrical conductor;
simultaneously drawing the electrical conductor and the tube of magnetostrictive material in two or more drawing stages to simultaneously reduce the initial internal diameter of the tube of magnetostrictive material and the initial external diameter of the electrical conductor to a final internal diameter of the tube of magnetostrictive material that is equal to a final external diameter of the electrical conductor and thereby the composite waveguide is devoid of a longitudinal air gap between the internal core and the outer layer,
wherein said drawing changes the initial hardness to a desired, final hardness of the magnetostrictive material.

24. The method of claim 23, wherein said simultaneously drawing is performed until the composite waveguide has a length greater than 15 feet.

25. The method of claim 24, wherein said simultaneously drawing is performed until the composite waveguide has a length greater than 25 feet.

* * * * *